United States Patent [19]
Hauptmann

[11] Patent Number: 5,727,024
[45] Date of Patent: Mar. 10, 1998

[54] CIRCUIT CONFIGURATION FOR CONVERSION OF A ONE-BIT DIGITAL SIGNAL INTO AN ANALOG SIGNAL

[75] Inventor: Joerg Hauptmann, Villach, Austria

[73] Assignee: Siemens Aktiengesellschaft, Munich, Germany

[21] Appl. No.: 606,475

[22] Filed: Mar. 4, 1996

[30] Foreign Application Priority Data

Mar. 2, 1995 [DE] Germany ............... 195 07 311.8

[51] Int. Cl.[6] .................................................. H04B 14/06
[52] U.S. Cl. .......................... 375/247; 341/144; 341/146
[58] Field of Search .............................. 375/241, 242, 375/247, 248; 341/76, 77, 144, 150, 146, 145

[56] References Cited

U.S. PATENT DOCUMENTS 5,302,950  4/1994  Johnson et al. ..................... 341/123
5,323,158  6/1994  Ferguson, Jr. ...................... 341/143

OTHER PUBLICATIONS

"A Multistage Delta–Sigma Modulator without Double . . . ", Toshio Hayashi et al., IEEE International Solid–State Circuits Conference, 1986, pp. 182–183.

Primary Examiner—Stephen Chin
Assistant Examiner—Bryan Webster
Attorney, Agent, or Firm—Herbert L. Lerner; Laurence A. Greenberg

[57] ABSTRACT

A circuit configuration for converting a one-bit digital signal at a given sampling frequency into an analog signal, includes a multiplication device having one input receiving the digital signal, another input receiving a reference signal and an output. A delay device receives the digital signal, delays the digital signal by one period of a sampling frequency and has an output. A further multiplication device has one input connected to the output of the delay device, another input receiving the reference signal and an output. An adding device has inputs each being connected to the output of a respective one of the multiplication devices and an output at which the analog signal is available.

6 Claims, 2 Drawing Sheets

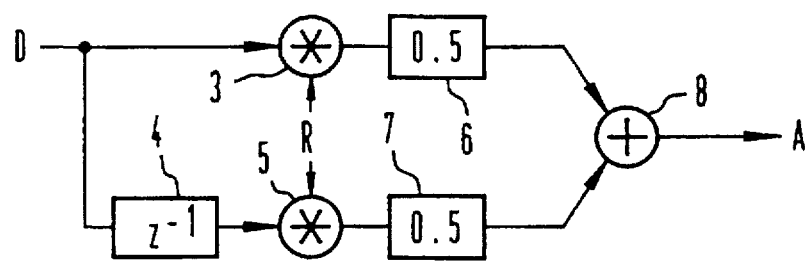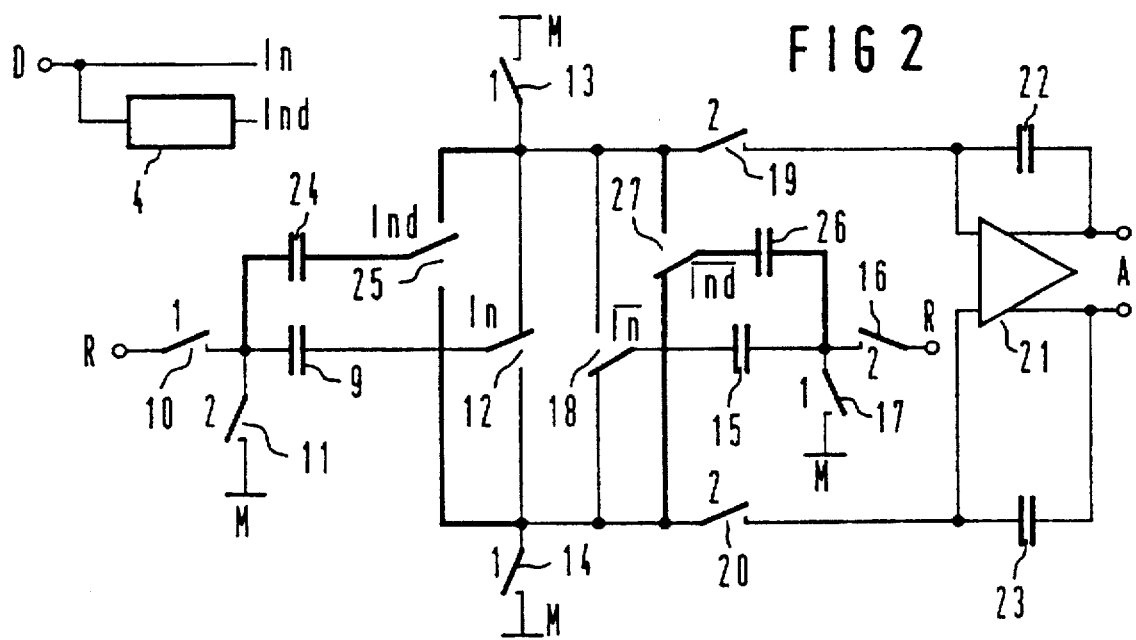

CIRCUIT CONFIGURATION FOR CONVERSION OF A ONE-BIT DIGITAL SIGNAL INTO AN ANALOG SIGNAL

BACKGROUND OF THE INVENTION

Field of the Invention

The invention relates to a circuit configuration for converting a one-bit digital signal at a given sampling frequency into an analog signal, including a multiplication device having one input to which the digital signal and another input to which a reference signal, are applied.

Such circuit configurations are used, for instance, in the feedback of a digital output signal of an analog/digital converter on the sigma-delta principle to its analog input circuit. A circuit configuration of the type referred to at the outset, and its use in an analog/digital converter on the sigma-delta principle is described in an article entitled: A Multi-Stage Delta-Sigma Modulator Without Double Integration Loop, by T. Hayashi et al, in IEEE International Solid-State Circuits Conference, 1986, pp. 182 and 183. With that type of converter, an analog input signal is converted into a digital one-bit output signal. The high quantizing noise being produced is shifted out of the base band to higher frequencies by what is known as the "noise shaping function" and is then damped through the use of digital filters. The corresponding digital/analog converter functions essentially according to the same principles but in the reverse order. That means that first digital noise shaping is performed, and that is followed by the digital/analog conversion and then by analog filtering.

The noise shaping function of the sigma-delta converters not only has the property of shifting the quantizing noise to higher frequencies, but also tends to form limit cycles when there are direct voltages at the input. Depending on the order of the noise shaping function, those limit cycles are more or less pronounced and occur at low direct voltages in the range of half the sampling frequency. Such a case occurs, for instance, whenever no signal is present at the input, yet a direct voltage component occurs from internal offset voltages of the analog components, such as amplifiers, filters and converters. The greater the offset voltage, the farther the limit cycles are from half the sampling frequency. In an ideal case, limit cycles are no hindrance, since they are located outside the base band and are eliminated by the ensuing filtering.

The one-bit digital/analog conversion that is necessary in all sigma-delta principles is equivalent to a multiplication of a digital one-bit pulse density signal by an analog reference signal. Since the converters are typically operated in combination with other digital circuitry units, such as a signal processor, and can usually even be integrated on one and the same chip, their clock pulses very readily enter the reference signal in the form of noise signals. Often, the frequency of the noise signal is equivalent to half the sampling frequency.

Multiplying the digital one-bit pulse density signal by a limit cycle, which results from an input offset and has a frequency, for instance, of half the sampling frequency minus a low-frequency signal of 2 kHz, for example, and by a reference signal on which a noise signal at half the sampling frequency is superimposed, causes a convolution of the limit cycle in the base band, and the low-frequency signal caused by the offset becomes audible.

The level of such limit cycles depends on the magnitude of the noise coupled into the reference signal and can appear as a discrete line in the noise spectrum. Along with such limit cycles, the noise spectrum is also convoluted by half the sampling frequency into the base band and thus lowers the signal-to-noise ratio even further.

SUMMARY OF THE INVENTION

It is accordingly an object of the invention to provide a circuit configuration for conversion of a one-bit digital signal into an analog signal, which overcomes the hereinafore-mentioned disadvantages of the heretofore-known devices of this general type.

With the foregoing and other objects in view there is provided, in accordance with the invention, a circuit configuration for converting a one-bit digital signal at a given sampling frequency into an analog signal, comprising a multiplication device having one input receiving a digital signal, having another input receiving a reference signal and having an output; a delay device receiving the digital signal, delaying the digital signal by one period of a sampling frequency and having an output; a further multiplication device having one input connected to the output of the delay device, having another input receiving the reference signal and having an output; and an adding device having inputs each being connected to the output of a respective one of the multiplication devices and having an output at which an analog signal is available.

In accordance with another feature of the invention, there are provided damping devices each having a specific damping factor and each being connected between the output of a respective one of the multiplication devices and a respective one of the inputs of the adding device.

In accordance with a further feature of the invention, at least one of the multiplication devices has a switch being controlled by the digital signal, the switch having one switching state for connecting through the reference signal and another switching state for connecting through an inverted reference signal to the output.

In accordance with an added feature of the invention, the two multiplication devices and the adding device include first through twelfth switches having terminals; a first capacitor having one terminal to be switched through the first switch to the reference signal and through the second switch to a ground potential, the first capacitor having another terminal to be switched through the third switch between one terminal of the fourth switch and one terminal of the fifth switch, the other terminals of the fourth and fifth switches being connected to ground potential; a second capacitor having one terminal to be switched through the sixth switch to the reference signal and through the seventh switch to ground potential, the second capacitor having another terminal to be switched through the eighth switch between one terminal of the fourth switch and one terminal of the fifth switch; a third capacitor having one terminal connected to the one terminal of the first capacitor and another terminal to be switched through the ninth switch between the one terminal of the fourth switch and the one terminal of the fifth switch; a fourth capacitor having one terminal connected to the one terminal of the second capacitor and another terminal to be switched through the tenth switch between the one terminal of the fourth switch and the one terminal of the fifth switch; and an integrator having one symmetrical input to be switched through the eleventh switch to the one terminal of the fourth switch and another symmetrical input to be switched through the twelfth switch to the one terminal of the fifth switch, the integrator having an output supplying the analog signal; the first, fourth, fifth and seventh switches being connected through by a first switching phase of a clock signal, and the second, sixth, eleventh and twelfth switches being connected through by a second switching phase of the clock signal being an inverse of the first switching phase; and the third switch being switched over by the digital signal, the eighth switch being switched over by the inverted digital signal, the ninth switch being switched over by the digital signal delayed by the delay device, and the tenth switch being switched over by an inverted, delayed digital signal.

With the objects of the invention in view, there is also provided a digital/analog converter, or an analog/digital converter, operating on the sigma-delta principle, comprising the circuit configuration for converting a one-bit digital signal at a given sampling frequency into an analog signal.

It is an advantage of the invention that extensive noise suppression is attained at little additional expense for circuitry.

Other features which are considered as characteristic for the invention are set forth in the appended claims.

Although the invention is illustrated and described herein as embodied in a circuit configuration for conversion of a one-bit digital signal into an analog signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a basic embodiment of a circuit configuration according to the invention;

FIG. 2 is a schematic diagram of an embodiment of the circuit configuration according to the invention which is constructed in switched capacitor technology;

DESCRIPTION OF THE PREFERRED EMBODIMENTS

Figure 3:
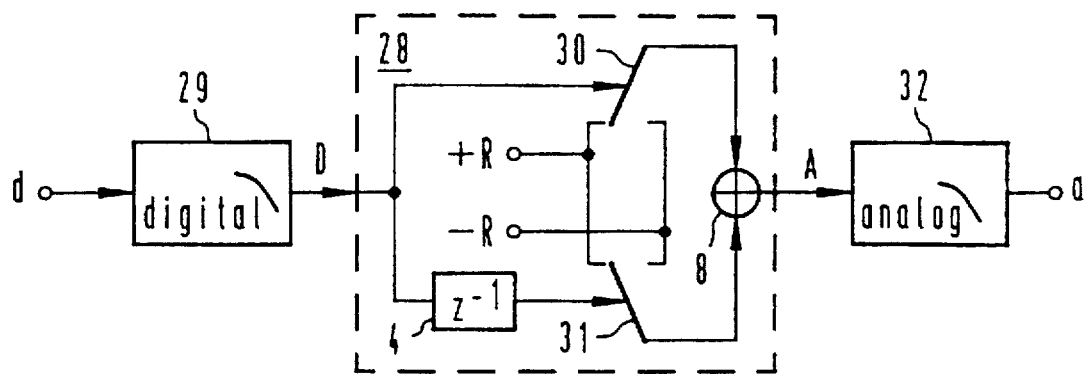
FIG. 3 is a block diagram of an application of a circuit configuration according to the invention to a digital/analog converter operated on the sigma-delta principle.

Referring now to the figures of the drawing in detail and first, particularly, to FIG. 1 thereof, there is seen an exemplary embodiment in which a digital one-bit pulse density signal is applied both to one input of a multiplication device 3 and to an input of a delay device 4. The delay device 4 delays a digital signal D by one sampling clock period. An output of the delay device 4 is carried to one input of a further multiplication device 5. Other respective inputs of the two multiplication devices 3 and 5 are each occupied by a reference signal R. The multiplication devices 3 and 5 are each followed by a respective damping device 6 and 7, each of which effects damping by half. However, the dampings of both damping devices 6 and 7 may also assume arbitrary values dependent on a particular application. However, identical damping values are preferably chosen. Different amplitude and frequency responses can be attained by varying the damping values. Outputs of the two damping devices 6 and 7 are each carried to a respective input of an analog adding device 8, having an output at which an analog signal A corresponding to the digital signal D is present.

In the exemplary embodiment of FIG. 2, the two multiplication devices, the damping devices and the adding devices are constructed as a switched capacitor network. This switched capacitor network has a first capacitor 9 with one terminal that can be connected through a first switch 10 to a reference signal R and through a second switch 11 to a ground potential M. Another terminal of the capacitor 9 can be connected through a reversing third switch 12 either to one terminal of a fourth switch 13 or to one terminal of a fifth switch 14. Other terminals of the switches 13 and 14 are each connected to the ground potential M. One terminal of a second capacitor 15 can be connected through a sixth switch 16 to the reference signal R and through a seventh switch 17 to the ground potential M. Another terminal of the capacitor 15 can be switched through a reversing eighth switch 18 either to one terminal of the switch 13 or to one terminal of the switch 14. The one terminal of the switch 13 and the one terminal of the switch 14 can each be connected through a respective eleventh and twelfth switch 19 and 20 to a respective input of an integrator. The integrator in turn includes a symmetrical operational amplifier 21, which is fed back by respective capacitors 22 and 23 between an inverting input and a noninverting output as well as between a noninverting input and an inverting output. The analog signal A is available at the symmetrical outputs of the operational amplifier 21. In this configuration, the multiplication device 3 and the damping device 6 of FIG. 1 are both achieved.

In order to achieve the multiplication device 5 and the damping device 7, a third capacitor 24 which is additionally provided has one terminal connected to the one terminal of the capacitor 9 and another terminal that can be connected through a reversing ninth switch 25 either to the one terminal of the switch 13 or the one terminal of the switch 14. In addition, one terminal of a fourth capacitor 26 is connected to the one terminal of the capacitor 15. Another terminal of the capacitor 26 can be connected through a reversing tenth switch 27 either to the one terminal of the switch 13 or the one terminal of the switch 14.

In order to control the individual switches, on one hand two switching phases 1 and 2 of a clock signal, or two switching phases In and $\overline{\text{In}}$ of the digital signal D or two switching phases Ind and $\overline{\text{Ind}}$ of the delayed digital signal D, are used. The switches 10, 13, 14 and 17 are connected through by the switching phase 1, and the switches 11, 16, 19 and 20 are connected through by the switching phase 2. The reversing switches 12 and 18 are respectively switched by the switching phase In and $\overline{\text{In}}$ to the one terminal of the switch 14 and to the one terminal of the switch 13. Accordingly, the reversing switches 25 and 27 are switched by the switching phases Ind and $\overline{\text{Ind}}$ to the one terminal of the switch 14 and the one terminal of the switch 13, respectively. The addition of the two different multiplied signals is carried out on one hand at the one terminal of the switch 13 and on the other hand at the one terminal of the switch 14. Due to the symmetry, the capacitors 22 and 23 are identical to one another, and the capacitors 9 and 15 are identical to one another. The capacitors 24 and 26 may also be identical to one another. The ratio of the damping devices 6 and 7 is adjusted in proportion to the capacitors 9 and 15 through the use of the capacitances of the capacitors 24, 26. If a damping value of 0.5 each is chosen, then the capacitance of the capacitors 9 and 15 is halved, as compared with when only a single multiplication device 3 is used. Since in that case the capacitance of the capacitors 24 and 26 is also identical to the capacitance of the capacitors 9 and 15, or in other words is also half, the total capacitor surface area which is required then remains the same. In other words, as a result of the damping factor of 0.5, a halving of the capacitor values is attained, and as a result, in an embodiment of the circuit configuration of the invention by integrated circuitry, the increase in surface area of the integrated circuit is limited merely to the two additional reversing switches 25 and 27 and the delay device 4.

FIG. 3 shows an application of a circuit configuration 28 according to the invention in a digital/analog converter on the sigma-delta principle. A digital signal d to be converted is supplied to a digital filter 29, through the use of which a noise shaping of the signal D is carried out. The digital signal D supplied to the circuit configuration 28 is available at the output of the digital filter 29. As compared with the embodiment of the circuit configuration according to the invention that is illustrated in FIG. 1, the embodiment of FIG. 3 has been modified in such a way that both multiplication devices each have a respective switch 30 and 31, controlled by the digital signal D, which in one switching state each connect through a positive reference signal +R and in the other switching state each connect through a negative reference signal -R to the respective input of the adding device 8. The switch 31 is triggered by the digital signal D delayed by the delay device 4. In this embodiment, the dampings of the damping devices 6 and 7 are replaced by a suitable choice of the two reference voltages +R and -R, and in this case the two damping factors are always the same. The analog signal A available at the output of the adding device 8 is supplied to an analog filter 32 for the purposes of band limitation. An analog signal a which originates in the digital signal d is thus available at an output of the analog filter 32.

Figure 4:
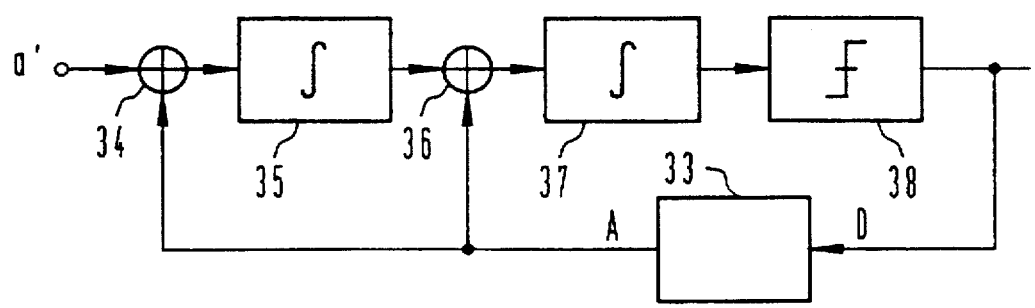
FIG. 4 is a block diagram of an application of a circuit configuration according to the invention to an analog/digital converter operated on the sigma-delta principle.

A further preferred application of a circuit configuration 33 according to the invention is shown in FIG. 4 for an analog/digital converter on the sigma-delta principle. The circuit configuration 33, by way of example, is equivalent to the embodiment of FIG. 2 in layout. An analog signal a' to be converted, given a second order sigma-delta principle, for instance, is applied to an input of an adder 34 having another input which is acted upon by the analog signal A that is available at the output of the circuit configuration 33. An output of the adder 34 is followed by a first integrator 35, having an output which is in turn carried to one input of an adder 36. Another input of the adder 36 is also acted upon by the analog signal A. The adder 36 is followed by a second integrator 37, which is followed by a comparator 38. The comparator 38 outputs the digital signal D, which on one hand is supplied to the circuit configuration 33 of the invention and on the other hand is available for further processing, for instance through the use of a digital filter.

The mode of operation of the circuit configuration of the invention is based on the fact that a notch filter function is generated, having its greatest damping which occurs at half the sampling frequency. Limit cycles at about half the sampling frequency and noise components at half the sampling frequency in the reference signal are thereby filtered out. This avoids both convolution of the limit cycles and noise in the base band.

I claim:

1. A circuit configuration for converting a one-bit digital signal at a given sampling frequency into an analog signal, comprising:

a multiplication device having one input receiving a digital signal, having another input receiving a reference signal and having an output;

a delay device receiving the digital signal, delaying the digital signal by one period of a sampling frequency and having an output;

a further multiplication device having one input connected to the output of said delay device, having another input receiving the reference signal and having an output; and an adding device having inputs each being connected to the output of a respective one of said multiplication devices and having an output at which an analog signal is available.

2. The circuit configuration according to claim 1, including damping devices each having a specific damping factor and each being connected between the output of a respective one of said multiplication devices and a respective one of the inputs of said adding device.

3. The circuit configuration according to claim 1, wherein at least one of said multiplication devices has a switch being controlled by the digital signal, said switch having one switching state for connecting through the reference signal and another switching state for connecting through an inverted reference signal to the output.

4. The circuit configuration according to claim 1, wherein said two multiplication devices and said adding device include:

a first switch, a second switch, a third switch, a fourth switch, a fifth switch, a sixth switch, a seventh switch, a eighth switch, a ninth switch, a tenth switch, a eleventh switch, and a twelfth switch each have terminals;

a first capacitor having one terminal to be switched through said first switch to the reference signal and through said second switch to a ground potential, said first capacitor having another terminal to be switched through said third switch between one terminal of said fourth switch and one terminal of said fifth switch, the other terminals of said fourth and fifth switches being connected to ground potential;

a second capacitor having one terminal to be switched through said sixth switch to the reference signal and through said seventh switch to ground potential, said second capacitor having another terminal to be switched through said eighth switch between one terminal of said fourth switch and one terminal of said fifth switch;

a third capacitor having one terminal connected to the one terminal of said first capacitor and another terminal to be switched through said ninth switch between the one terminal of said fourth switch and the one terminal of said fifth switch;

a fourth capacitor having one terminal connected to the one terminal of said second capacitor and another terminal to be switched through said tenth switch between the one terminal of said fourth switch and the one terminal of said fifth switch; and an integrator having one symmetrical input to be switched through said eleventh switch to the one terminal of said fourth switch and another symmetrical input to be switched through said twelfth switch to the one terminal of said fifth switch, said integrator having an output supplying the analog signal;

said first, fourth, fifth and seventh switches being connected through by a first switching phase of a clock signal, and said second, sixth, eleventh and twelfth switches being connected through by a second switching phase of the clock signal being an inverse of the first switching phase; and said third switch being switched over by the digital signal, said eighth switch being switched over by the inverted digital signal, said ninth switch being switched over by the digital signal delayed by said delay device, and said tenth switch being switched over by an inverted, delayed digital signal.

5. A digital/analog converter operating on the sigma-delta principle, comprising:

- a circuit configuration for converting a one-bit digital signal at a given sampling frequency into an analog signal, including:
- a multiplication device having one input receiving a digital signal, having another input receiving a reference signal and having an output;
- a delay device receiving the digital signal, delaying the digital signal by one period of a sampling frequency and having an output;
- a further multiplication device having one input connected to the output of said delay device, having another input receiving the reference signal and having an output; and an adding device having inputs each being connected to the output of a respective one of said multiplication devices and having an output at which an analog signal is available.

6. In an analog/digital converter operating on the sigma-delta principle, a digital/analog converter comprising:

- a circuit configuration for converting a one-bit digital signal at a given sampling frequency into an analog signal, including:
- a multiplication device having one input receiving a digital signal from the A/D converter, having another input receiving a reference signal and having an output;
- a delay device receiving the digital signal from the A/D converter, delaying the digital signal by one period of a sampling frequency and having an output;
- a further multiplication device having one input connected to the output of said delay device, having another input receiving the reference signal and having an output; and
- an adding device having inputs each being connected to the output of a respective one of said multiplication devices and having an output at which an analog signal is available.

* * * * *